United States Patent
Hunt et al.

[11] Patent Number: 6,056,857
[45] Date of Patent: May 2, 2000

[54] CRYOGENIC ANNEALING OF SPUTTERING TARGETS

[75] Inventors: Thomas J. Hunt, Peekskill; Paul S. Gilman, Suffern; James E. Joyce, Bedford, all of N.Y.; Chi-Fung Lo, Fort Lee, N.J.; Darryl Draper, Congers, N.Y.

[73] Assignee: Praxair S.T. Technology, Inc., North Haven, Conn.

[21] Appl. No.: 08/910,334

[22] Filed: Aug. 13, 1997

[51] Int. Cl.⁷ .................................................. C23C 14/34
[52] U.S. Cl. .............................. 204/192.15; 204/192.12; 204/298.12; 204/298.13; 148/577
[58] Field of Search ................... 148/577; 204/192.1, 204/192.12, 192.15, 298.12, 298.13

[56] References Cited

U.S. PATENT DOCUMENTS 2,949,392  8/1960  Willey et al. ........................... 148/577
5,160,388  11/1992  Legresy et al. .................... 204/298.13

*Primary Examiner*—Rodney G. McDonald
*Attorney, Agent, or Firm*—Wood, Herron & Evans, L.L.P.

[57] ABSTRACT

Sputtering targets are cryogenically annealed to provide a uniformly dense molecular structure by placing the target in a temperature-controlled cryogenic chamber and cooling the chamber to a cryogenic temperature at a controlled rate. The target is maintained at a cryogenic temperature to cryogenically anneal the target and the target is subsequently returned to ambient or elevated temperature. Improvements in sputtered particle performance and early life film uniformity are achieved with the cryo-annealed targets.

16 Claims, 2 Drawing Sheets

CRYOGENIC ANNEALING OF SPUTTERING TARGETS

FIELD OF THE INVENTION

The present invention relates to a method for cryogenically annealing a sputtering target to provide a uniformly dense molecular target structure. Improvements in sputtered particle performance and early life uniformity are achieved with the cryo-annealed targets.

BACKGROUND OF THE INVENTION

The materials and/or alloys of sputtering targets have inherent characteristics that are a result of target manufacturing processes. These characteristics, for example, target density, sputtered particle performance, and uniformity, have an effect on the end use of the target. One undesirable effect of target manufacture is a lack of early life uniformity as measured on a wafer as used in the semi-conductor industry. Typically, sputtering targets made from aluminum, and various alloys thereof, exhibit a sputtered film uniformity of 0–3% deviation of sheet resistance as measured by a four-point resistivity probe on a 6 inch wafer. The acceptable range for such deviation is 0–1.67% per 6 inch wafer. Any improvement in uniformity would reduce rejects at the customer site. Further, an improvement in early life uniformity will increase the utilization of the sputtering targets and increase sputtering tool productivity.

Another undesirable effect of target manufacture is unwanted particles on a wafer generated during sputtering. Typically, targets made from W/Ti 10% using standard powder metallurgy processes exhibit high particle counts greater than 10 particles >0.3 micrometer size per 6 inch wafer. This also causes a relatively high rejection rate of wafers.

The previous efforts to achieve particle reduction and early life uniformity have proved costly and ineffective. Unaccountable variances in target manufacturing directly affect product end use characteristics. Sputtering targets of marginal acceptance are scrapped. There is a need to improve sputtering target characteristics while maintaining the cost efficient metallurgical processes for manufacturing high performance targets.

SUMMARY OF THE INVENTION

The present invention is directed to a method for cryogenically annealing a sputtering target to provide a uniformly dense molecular target structure. This method relieves residual stresses in the target resulting from its manufacture and stabilizes the target thereby allowing for a more consistent product. The method causes no adverse effects on the target and is easily tailored to standard metallurgical sputtering target manufacturing processes.

The preferred method of the present invention comprises placing a sputtering target in a temperature-controlled cryogenic chamber. The target is cooled in the chamber with a liquified gas to a cryogenic temperature at a controlled rate to avoid target fracture. The target is maintained at the cryogenic temperature for a period of time sufficient to cryogenically anneal the target. Thereafter, the target may be returned to ambient or elevated temperature while remaining in the cryogenic chamber, or may be removed from the cryogenic chamber and allowed to warm to ambient temperature.

The liquified gas used for cooling the cryogenic chamber includes helium, hydrogen, argon, nitrogen and oxygen. Preferably, the liquified gas is nitrogen for reasons of safety and cost. The cryogenic chamber housing the target may be computer controlled to cool the temperature of the chamber at a controlled rate of, for example, approximately –0.55° C. per minute. Once the temperature has been reduced at the controlled rate in the chamber to the cryogenic temperature of liquified nitrogen (–185° C.), this temperature is maintained for a period of time sufficient to cryogenically anneal the target housed in the chamber. The duration of time required to cryogenically anneal the sputtering target varies with the target composition. For example, to cryo-anneal a sputtering target of W/Ti, the target must be maintained at the cryogenic temperature for approximately 12 hours. However, it is to be understood that the present invention may be used with similar effectiveness on sputtering targets of any alloy or composition which may be suitable for use as a sputtering target, such as those including aluminum, titanium, zirconium, hafnium, chromium, cobalt, nickel, tantalum and tungsten.

A sputtering target that has been cryogenically annealed has substantially reduced internal and external stresses that result from the initial target manufacturing process. Further, a cryogenically annealed target produces a reduced unwanted sputtered particle count by approximately 30–40% and has a more dense molecular structure. Improved film uniformity of approximately 30% throughout the life of the target is also achieved by cryogenic treatment.

Other details and embodiments of this invention will be understood with reference to the drawings and the following detailed description.

DETAILED DESCRIPTION OF THE INVENTION

I. Sputtering Target Manufacturing Processes

Metallurgical processes for manufacturing sputtering targets prior to cryogenic treatment include pressing, forging, rolling and forming, more specifically, hot hydraulic pressing, hot isostatic pressing (HIP), and melting methods. Hot hydraulic pressing uses a consolidation furnace temperature of up to 1800° C. in protected atmospheres, and a unidirectional pressure up to 300 kg/cm$^2$.

Hot isostatic pressing uses a high pressure (15,000 to 40,000 psi), and a high temperature (500–1600° C.) chamber in which the sputtering target compositions are consolidated without changing composition and stoichiometric ratio. Target densities are very close to the theoretical density due to the isostatic nature of high pressure applied during the consolidation.

Melting methods for the preparation of sputtering target compositions in a protected atmosphere or vacuum include electron beam melting, induction melting, or arc melting.

Figure 1:
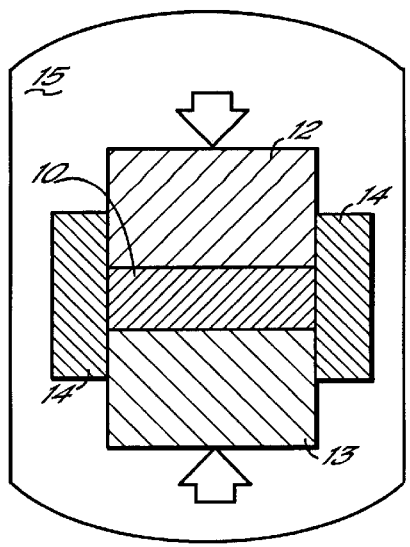
FIG. 1 is a schematic drawing of an example of a hot hydraulic pressing system used for manufacturing sputtering targets.

With reference to FIG. 1, a hot hydraulic pressing system may be used to manufacture sputtering targets of any alloy or composition which may be suitable for use as a sputtering target. Such alloys or compositions are preferably made from aluminum, titanium, zirconium, hafnium, chromium, cobalt, nickel, tantalum and tungsten. By placing the blended powdered components having particle sizes less than 200 microns of any of the above particular targets between an upper pressing head 12, a lower pressing head 13, and an outer die 14, when the temperature of the die in the furnace 15 is raised, the temperature of the targets will be raised up to a maximum of about 1800° C. and the hydraulic force applied to it will create a unidirectional pressure up to 300 kg/cm$^2$. In a protective atmosphere or vacuum, or combination of both, the required target components will be consolidated to the required properties and reach, or be close to, the full density of the target composition (density of the materials is a function of composition and stoichiometric ratio). Depending on the availability, either induction heating or resistance heating can be applied for the heating of the above process.

Figure 2:
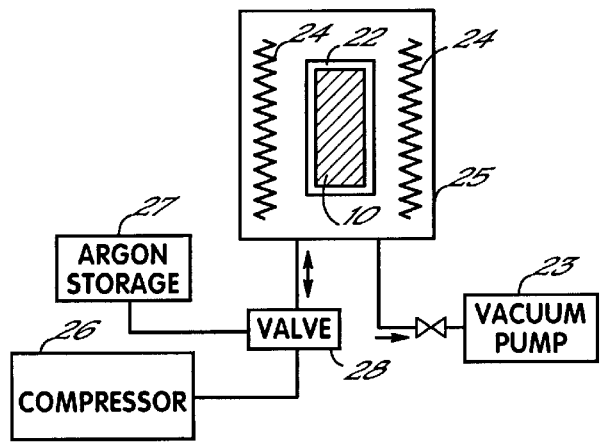
FIG. 2 is a schematic drawing of an example of a hot isostatic pressing system alternatively used for manufacturing sputtering targets.

With reference to FIG. 2, a hot isostatic pressing system may be used to manufacture the target compositions 10 in a sealed container 22, surrounded by heating elements 24, placed in the hot zone of the pressure vessel 25. After an initial vacuum pumping by a vacuum pump 23 of vessel 25, the target's powder blend is subjected to very high isostatic pressure (15,000 to 40,000 psi) created by the compressed argon from argon storage 27, as compressed by argon compressor 26 and controlled by a valve 28. Heat generated by heating elements 24 bring the target powder composition to elevated temperature up to 1600° C. Under these conditions, the targets are consolidated to, or close to, the full density of the particular target composition or alloy.

Figure 3:
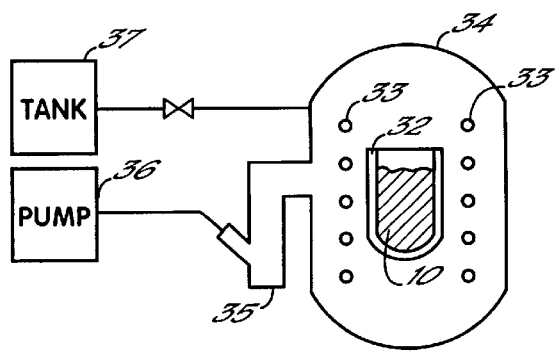
FIG. 3 is a schematic drawing of an induction melting system alternatively used for manufacturing sputtering targets.

With reference to FIG. 3, a typical induction melting furnace with vacuum/protective gas capability may be used. The target compositions are placed in a crucible 32 and heated to a temperature above the melting points of the particular elements used in the target by induction coil 33. The furnace chamber 34 is vacuum pumped first by a mechanical pump 36 and then diffusion pump 35, before the backfilling of protective gas from tank 37. This process consolidates the particular compositions of the suitable target materials at the high temperature to produce the required properties and densities needed for sputtering target manufacture.

II. Sputtering Target Cryogenic Annealing Process

Figure 4:
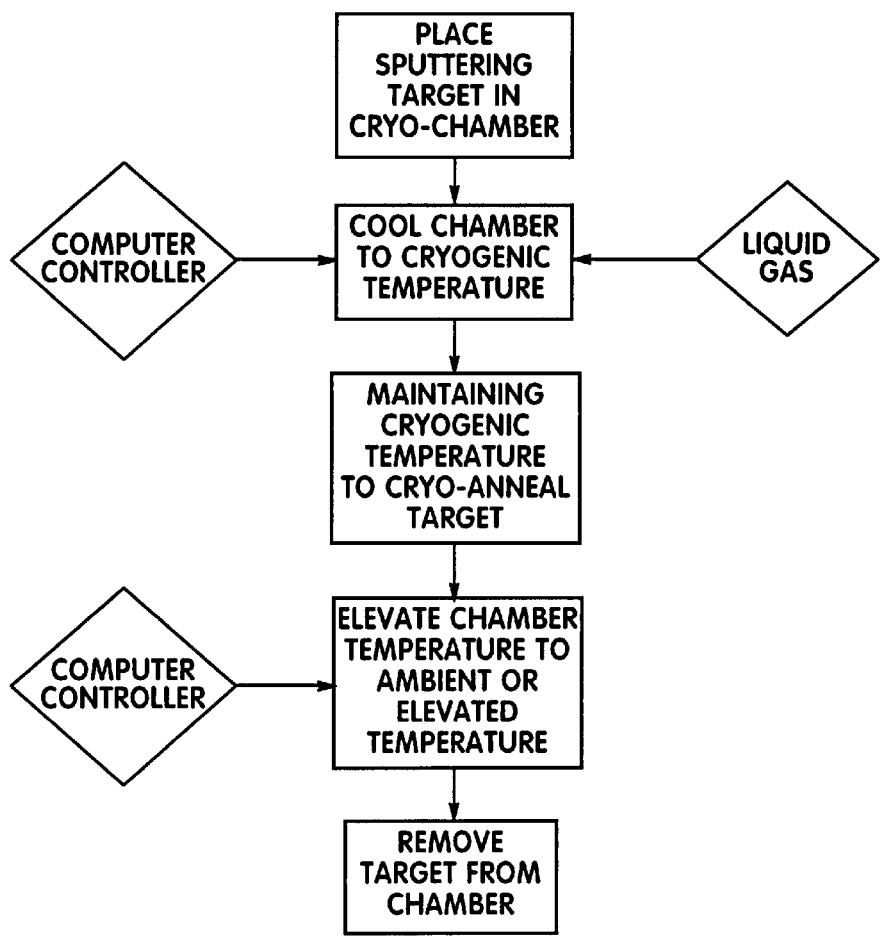
FIG. 4 is a flow chart outlining steps for cryogenically annealing targets.

With reference to FIG. 4, the flow chart outlines the steps for controlled cryogenic treatment of targets. Controlled treatment simply means that the process is performed according to a precise prescribed time table depending on the particular target material being cryogenically treated and annealed. Computers may be utilized as a process controller for operating the descent of a temperature in a chamber, maintaining the cryogenic temperature once it has been reached, and the subsequent ascent mode from the cryogenic temperature to ambient or elevated temperature. Specifically, a sputtering target manufactured by one of the above detailed processes is placed in the cryogenic chamber and the computer-controlled treatment cycle is initiated. First, the material in the chamber is cooled slowly to approximately −185° C. (temperature of liquid nitrogen), held for a duration of time sufficient to cryo-anneal the target material housed in the chamber, and then raised to an elevated temperature under a similar computer-controlled rate. The overall process is a "dry" process in that the targets are not bathed in liquid nitrogen.

Cryogenic treatment consists of a slow cool-down, 0.55° C. per minute (approximately 1° F. per minute) from ambient temperature to liquid nitrogen temperature, or the temperature of other suitable liquid gases. When the material reaches approximately −185° C., it is maintained for an appropriate time sufficient to cryo-anneal the target material housed in the cryogenic chamber. At the end of cryo-annealing, the target is allowed to warm to room temperature at a controlled rate within the chamber. By conducting the cool-down cycle with liquid nitrogen, the temperature can be controlled accurately via computer and thermal shock and fracture of the target material is avoided.

Properly controlled, dry cryogenic processing transforms the target microstructure into a more refined, uniform, and more dense molecular structure that is stronger and exhibits advantageous characteristics upon sputtering onto a substrate. A computer for the cryogenic processing system duplicates an optimal cooling curve for a given target material so the temperature of the target mass descends at an even and slowly controlled rate. This computer-controlled rate is repeatable time after time.

The following examples and tables further illustrate the invention.

EXAMPLE 1

A 300 mm diameter sputtering target of W/10 wt % Ti was prepared by hot-pressing. Tungsten powder having an average particle size of 5 micrometers and 99.999% purity was mixed with 10 weight titanium powder having an average particle size of 30 micrometers and 99.999% purity. Mixing was performed in a ball mill jar. After mixing, the powder was hot-pressed in a graphite die mold in an inert gas atmosphere at 1 kpsi and 1300° C. for 3 hours. The pressed blank was machined to the target configuration prior to being bonded with a copper backing plate. The W/TI target assembly was then sputtered using an Endura 5500 PVD system. A 3000 angstrom film was deposited on the 125 mm silicon oxide wafers using the sputtering parameters of 6 kw power, 200° C. wafer temperature, 30 sccm gas flow, and 43 mm target to wafer distance. The deposited wafers were measured for the particles greater than 0.3 micrometers using a Tencor Surfscan 6200 particle counter. The particle counts for three tested wafers are listed in Table 1.

TABLE 1

| Particle Counts Before Cryo-Annealing | |
|---|---|
| Wafer # | Particles |
| 1 | 40 |
| 2 | 35 |
| 3 | 43 |

EXAMPLE 2

The cryo-annealing process of this invention was then demostrated by cryo-annealing the same W/Ti target material employed in EXAMPLE 1. With reference to FIG. 4, the W/Ti target was introduced into the cryognic chamber and a computer-controlled treatment cycle was initiated, First, the material in the chamber was cooled slowly to approximately −185° C. with liquid nitrogen, held for 24 hours sufficient to cryo-anneal the target, after which the chamber was slowly returned to ambient temperature and the target removed. After this cryogenic treatment, the target was then tested for particle performance under the same conditions as the W/Ti target of Example 1. The results of these tests are shown in Table 2.

TABLE 2

Particle Counts After Cryo-Annealing

| Wafer # | Particles |
|---------|-----------|
| 1 | 15 |
| 2 | 14 |
| 3 | 15 |

By comparison of the particle counts for the targets which were cryo-annealed employing the method of this invention in EXAMPLE 2, with the targets of EXAMPLE 1, the particle counts >0.3 micrometers were substantially reduced. Improvements in particle counts on the order of about 30–40%, or more, were achieved.

EXAMPLE 3

Early life uniformity performance of the cryo-annealed targets of this invention was determined by comparison with targets which were not subjected to cryo-annealing. A target of Al/Si, was prepared by induction melting followed by a combination of forming and machining. This target exhibited a sputtered film uniformity of about 2.32% deviation of sheet resistance as measured by a four-point resistivity probe on a 6 inch wafer at a target life of 21 KWH. The same Al/Si target was cryogenically annealed by the same process described above in Example 2. 12 The cryo-annealed Al/Si target was then tested for sputtered film uniformity and exhibited a 1.6% deviation of sheet resistance. Thus, the cryo-annealed target exhibited a 31% improvement in early life uniformity by comparison with the unannealed target.

While the present invention has been illustrated by description of various embodiments, it is not the intention of the applicants to restrict or in any way limit the scope of the following claims with such detail. Additional advantages and modifications will be apparent to those of ordinary skill in the art. The invention in its broader aspects is not limited to the specific details and illustrative examples shown and described. Departures may be made without departing from the spirit or scope of this invention.

What is claimed is:

1. A method for cryogenically annealing a sputtering target to provide a uniformly dense molecular target structure comprising placing a sputtering target having internal and external stresses in a temperature-controlled cryogenic chamber, cooling said chamber with a liquified gas from an ambient temperature to a cryogenic temperature at a controlled rate to cool the target and avoid target fracture, maintaining the target at said cryogenic temperature for a period of time sufficient to cryogenically anneal the target, whereby said internal and external stresses are relieved and a uniformly dense molecular target structure is provided, and returning the target structure to ambient or elevated temperature.

2. The method of claim 1 wherein said target is returned to ambient temperature.

3. The method of claim 1 wherein said liquified gas is selected from the group including helium, hydrogen, argon, oxygen and nitrogen.

4. The method of claim 1 wherein said liquified gas is nitrogen.

5. The method of claim 1 wherein said cryogenic temperature is below about −175° C.

6. The method of claim 4 wherein said chamber is cooled to about −185° C. with liquid nitrogen.

7. The method of claim 1 wherein said chamber is cooled at the controlled rate of approximately 0.55° C. per minute.

8. The method of claim 1 wherein said target is returned to ambient or elevated temperature at a controlled rate before removal from said chamber.

9. The method of claim 8 wherein said controlled rate returning said target to ambient or elevated temperature is approximately 0.55° C. per minute.

10. The method of claim 1 wherein said target comprises a metal selected from the group consisting of aluminum, titanium, zirconium, hafnium, chromium, cobalt, nickel, tantalum, and tungsten, and mixtures thereof.

11. The method of claim 1 further comprising sputtering said target structure to deposit a film onto a substrate.

12. The method of claim 1 wherein said sputtering target is manufactured by pressing, forging, rolling and forming.

13. The method of claim 1 wherein the cooling, maintaining and returning steps are computer controlled.

14. A method for cryogenically annealing a sputtering target to provide a uniformly dense molecular target structure for improved sputtered particle performance and uniformity comprising placing a sputtering target having internal and external stresses in a temperature-controlled cryogenic chamber, cooling said chamber from an ambient temperature with liquid nitrogen to a cryogenic temperature of approximately −185° C. at a computer-controlled rate to cool the target and to avoid target fracture, maintaining the target at approximately −185° C. for a period of time sufficient to cryogenically anneal the target, whereby said internal and external stresses are relieved and a uniformly dense molecular target structure is provided.

returning said target structure at a computer-controlled rate to an elevated temperature, and removing said target from said chamber.

15. The method of claim 14 wherein said computer-controlled rate in the range of about −2° C./min, to +2° C./min.

16. The method of claim 14 wherein said sputtering target comprising a molded element of a metal selected from a group consisting of aluminum, titanium, zirconium, hafnium, chromium, cobalt, nickel, tantalum and tungsten, and mixtures thereof.

* * * * *